(12) United States Patent
Ishimaru

(10) Patent No.: US 10,284,778 B2
(45) Date of Patent: May 7, 2019

(54) ELECTRONIC DEVICE CAPABLE OF DISPLAYING UPDATED VOLTAGES OF POWER SOURCES, METHOD FOR CONTROLLING ELECTRONIC DEVICE, AND STORAGE MEDIUM

(71) Applicant: CANON KABUSHIKI KAISHA, Tokyo (JP)

(72) Inventor: Satoshi Ishimaru, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/659,757

(22) Filed: Jul. 26, 2017

(65) Prior Publication Data
US 2018/0041700 A1 Feb. 8, 2018

(30) Foreign Application Priority Data

Aug. 4, 2016 (JP) ................................. 2016-153650

(51) Int. Cl.
*H04N 5/232* (2006.01)
*G09G 3/00* (2006.01)
*G01R 13/02* (2006.01)
*G01R 17/02* (2006.01)

(52) U.S. Cl.
CPC ......... *H04N 5/23241* (2013.01); *G01R 13/02* (2013.01); *G01R 17/02* (2013.01); *G09G 3/00* (2013.01); *H04N 5/23293* (2013.01)

(58) Field of Classification Search
CPC .. H04N 5/23241; H04N 5/23293; G09G 3/00; G01R 13/02; G01R 17/02

USPC ...................................................... 348/333.02
See application file for complete search history.

(56) References Cited

U.S. PATENT DOCUMENTS

| | | | |
|---|---|---|---|
| 2008/0278004 A1* | 11/2008 | Tokunaka | H04N 5/232 307/66 |
| 2010/0060082 A1* | 3/2010 | Qu | G03B 17/02 307/72 |
| 2011/0102136 A1* | 5/2011 | Nakashima | G06F 1/263 340/5.8 |
| 2012/0249190 A1* | 10/2012 | Kurokawa | H03M 1/123 327/109 |

(Continued)

FOREIGN PATENT DOCUMENTS

JP 2012-050198 * 3/2012 ............... B60L 3/00
JP 2012-050198 A 3/2012

*Primary Examiner* — Lin Ye
*Assistant Examiner* — Chan T Nguyen
(74) *Attorney, Agent, or Firm* — Cowan, Liebowitz & Latman, P.C.

(57) ABSTRACT

An electronic device includes a detection unit that detects voltages of main and sub-power sources and a control unit that controls a display of the voltage of the main power source and a display of the voltage of the sub-power source on a display unit such that the displayed voltage of the main power source is updated to a newly-detected voltage even if a change between the new and displayed voltages is smaller than a predetermined threshold, and that the displayed voltage of the sub-power source is not updated to a newly-detected voltage if a change between the new and displayed voltages is smaller than the predetermined threshold, but is updated to the newly-detected voltage if the change between the new and displayed voltages is equal to or greater than the predetermined threshold.

13 Claims, 5 Drawing Sheets

(56) References Cited

U.S. PATENT DOCUMENTS

2014/0029405 A1* 1/2014 Kurokawa ....... G11B 20/10481
369/107

* cited by examiner

ELECTRONIC DEVICE CAPABLE OF DISPLAYING UPDATED VOLTAGES OF POWER SOURCES, METHOD FOR CONTROLLING ELECTRONIC DEVICE, AND STORAGE MEDIUM

BACKGROUND OF THE INVENTION

Field of the Invention

The present invention relates to displaying of the voltages of power sources of an electronic device.

Description of the Related Art

Electronic devices that can use more than one power source are known. For example, an electronic device such as a digital camera includes an AC adapter and a battery as its power sources, and can choose which power source to use according to the situation.

Japanese Patent Application Laid-Open No. 2012-50198 discloses a display device that displays information on a main battery and information on a sub-battery on the same screen. This display device displays the remaining level of the sub-battery close to the remaining level of the main battery, so that a user can be easily aware of the status of the sub-battery.

To display a voltage value, the display device of Japanese Patent Application Laid-Open No. 2012-50198 needs to calculate a digital voltage by AD conversion of an analog voltage, which introduces AD conversion error. Thus, even when the actual voltage of a power source does not decrease, the display may indicate a decrease in the digital voltage. Then, when the power from the main power source is used while the sub-power source is not in use, such a display of a decrease in the power from the sub-power source may give the user a wrong impression that the power from the sub-power source is also in use.

SUMMARY OF THE INVENTION

An electronic device according to an embodiment of the present invention comprises: a detection unit configured to detect a voltage of a main power source and a voltage of a sub-power source; and a control unit configured to control a display of the voltage of the main power source and a display of the voltage of the sub-power source on a display unit such that the displayed voltage of the main power source is updated to a voltage newly detected by the detection unit even if a change between the new voltage and the displayed voltage is smaller than a predetermined threshold, and the displayed voltage of the sub-power source is not updated to a voltage newly detected by the detection unit if a change between the new voltage and the displayed voltage is smaller than a predetermined threshold, but is updated to the voltage newly detected by the detection unit if the change between the new voltage and the displayed voltage is equal to or greater than the predetermined threshold.

A method for controlling an electronic device according to an embodiment of the present invention comprises: detecting a voltage of a main power source and a voltage of a sub-power source; and controlling a display of the voltage of the main power source and a display of the voltage of the sub-power source on a display unit such that as the displayed voltage of the main power source is updated to a voltage newly detected in the detection step even if a change between the new voltage and the displayed voltage is smaller than a predetermined threshold, and that the displayed voltage of the sub-power source is not updated to a voltage newly detected in the detection step if a change between the new voltage and the displayed voltage is smaller than a predetermined threshold, but is updated to the voltage newly detected in the detection step if the change between the new voltage and the displayed voltage is equal to or greater than the predetermined threshold.

A non-transitory storage medium according to an embodiment of the present invention stores a program that causes an electronic device to perform: detecting a voltage of a main power source and a voltage of a sub-power source; and controlling a display of the voltage of the main power source and a display of the voltage of the sub-power source on a display unit such that as the displayed voltage of the main power source is updated to a voltage newly detected in the detection step even if a change between the new voltage and the displayed voltage is smaller than a predetermined threshold, and that the displayed voltage of the sub-power source is not updated to a voltage newly detected in the detection step if a change between the new voltage and the displayed voltage is smaller than a predetermined threshold, but is updated to the voltage newly detected in the detection step if the change between the new voltage and the displayed voltage is equal to or greater than the predetermined threshold.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

Figure 1A:
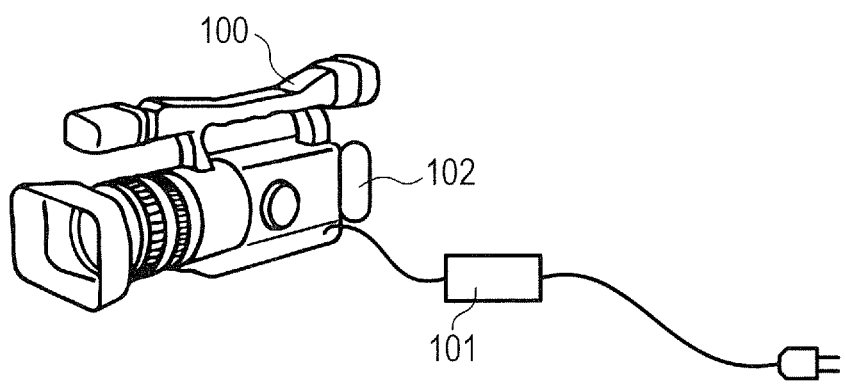
FIG. 1A is an external view of an electronic device according to a first embodiment of the present invention.

FIG. 1A is an external view of an electronic device according to the embodiment. The electronic device is for example a digital video camera 100, to which more than one power source can be attached. The digital video camera 100 includes an AC adapter 101 and a battery 102, and can use these power sources selectively. The digital video camera 100 can use the AC adapter 101 as a main power source for power supply, and the battery 102 as a sub-power source (auxiliary power source) for backup. The digital video camera 100 can also use the battery 102 as the main power source and the AC adapter 101 as the sub-power source. In a situation where the main power source is plugged off temporarily, the sub-power source may be used to provide the power.

Figure 1B:
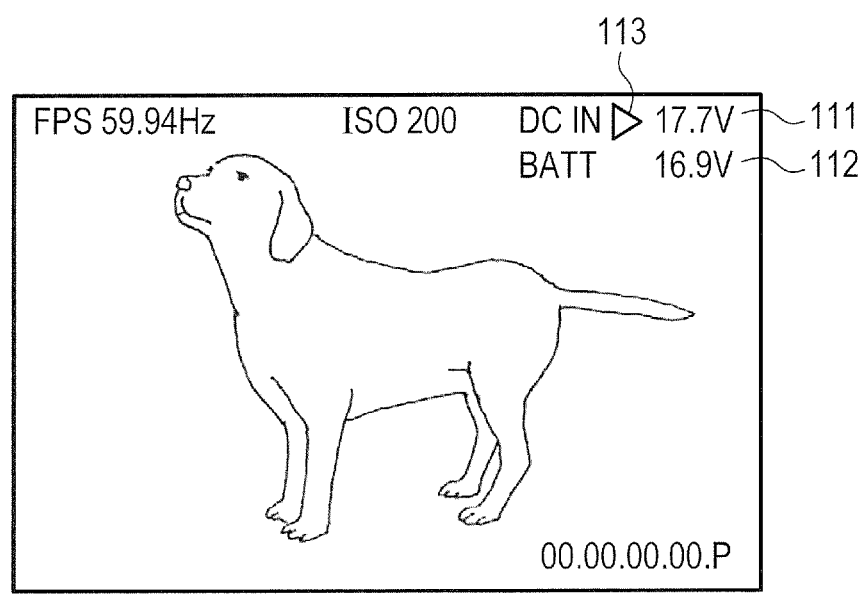
FIG. 1B is an example of a display on the electronic device according to the first embodiment of the present invention.

FIG. 1B is an example of a display on the electronic device according to the embodiment. An on-screen voltage display by the digital video camera 100 contains a voltage (DC IN) 111 of the AC adapter 101, a voltage (BATT) 112 of the battery 102, and a mark 113 that shows the main power source. The mark 113 in FIG. 1B indicates that the AC adapter 101 is in use as the main power source. The voltage display allows a user to be easily aware of the statuses of the power sources.

Figure 2:
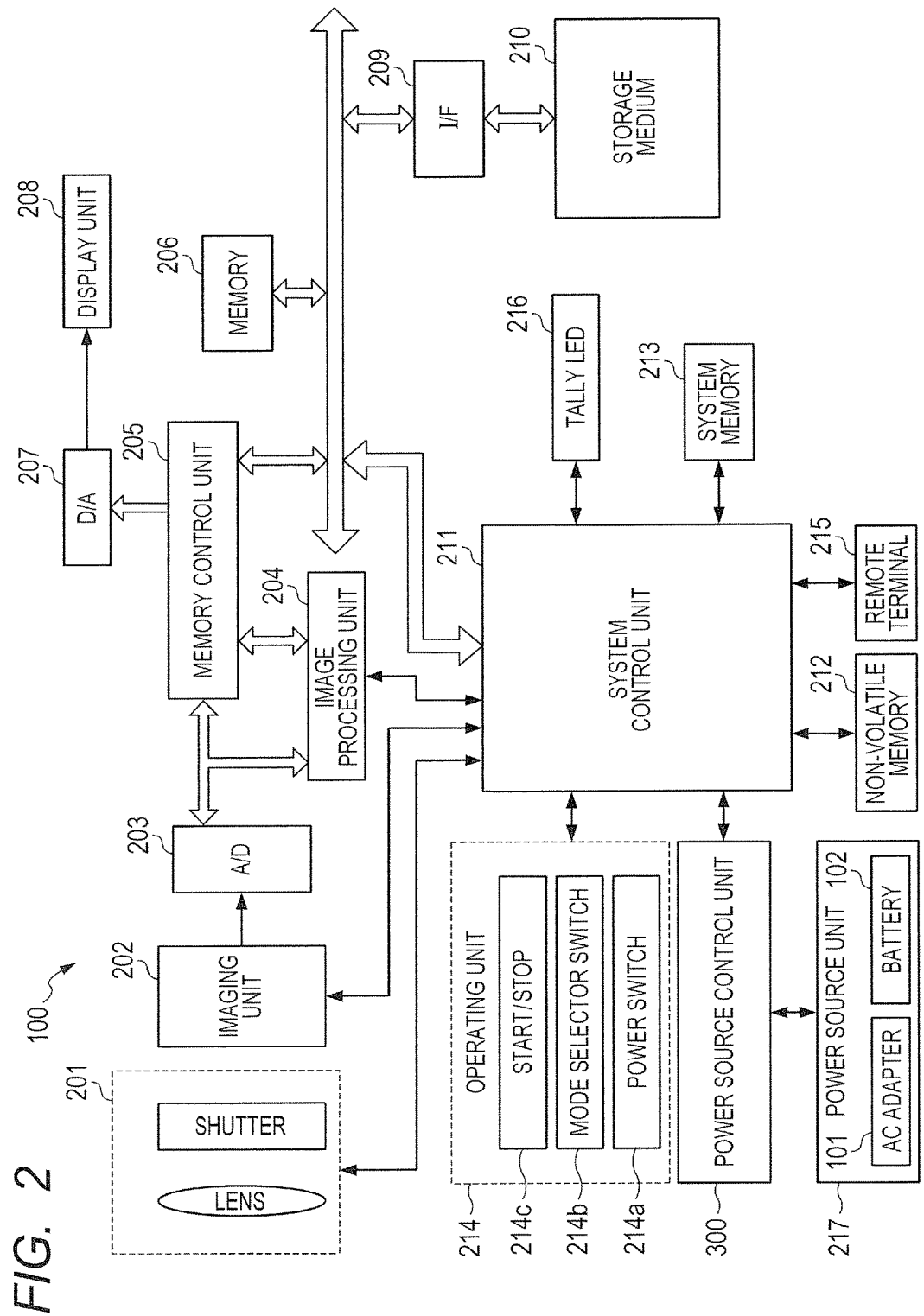
FIG. 2 is a block diagram of the electronic device according to the first embodiment of the present invention.

FIG. 2 is a block diagram of the electronic device according to the embodiment. The digital video camera 100, an example of the electronic device, includes an optical system 201, an imaging unit 202, an AD converter 203, an image processing unit 204, a memory control unit 205, a memory 206, a DA converter 207, a display unit 208, a storage-medium interface 209, and a storage medium 210. The digital video camera 100 further includes a system control unit 211, a non-volatile memory 212, a system memory 213, an operating unit 214, a remote terminal 215, a TALLY LED 216, a power source unit 217, and a power source control unit 300.

The optical system 201 is a member that includes components such as a shutter and lenses for focusing light from a subject onto the image plane of the imaging unit 202.

The imaging unit 202 is formed by an image pickup element such as a charge-coupled device (CCD) or a complementary MOS (CMOS), and converts a subject image from the optical system 201 into an electric signal. The AD converter (A/D) 203 converts the analog signal from the imaging unit 202 to a digital signal.

The image processing unit 204 processes the digital signal from the AD converter 203 and generates image data.

The memory control unit 205 is a processor that performs data exchange between memories and between a memory and another device, and particularly controls input and output of data to and from the memory 206. The memory 206 is for example a dynamic random-access memory (DRAM), and temporarily stores data such as the image data from the image processing unit 204 and various pieces of data to be displayed on the display unit 208. The memory 206 has a sufficient storage capacity to store a predetermined number of still images and a predetermined length of video images and audio, and is also used as a memory for image display (video memory).

The DA converter (D/A) 207 converts image data from the memory 206 into an analog signal, and supplies the analog signal to the display unit 208. The display unit 208 is formed by a liquid crystal display, an organic light-emitting display, or the like, and performs display in accordance with the analog signal from the DA converter 207. The display unit 208 functions as an electronic viewfinder by successively displaying images of a subject being captured by the optical system 201 (live view).

The storage-medium interface (I/F) 209 is an interface used for connection to the storage medium 210. The storage medium 210 is formed by a memory card, semiconductor memory, a magnetic disk, or the like, and records data on images captured by the digital video camera 100.

The system control unit 211 is formed by a central processing unit (CPU) and the like, and takes overall control of the operation of the digital video camera 100. The system control unit 211 performs processing for controlling the digital video camera 100, such as voltage display processing, by executing control programs stored in the non-volatile memory 212. The system control unit 211 drives and controls the optical system 201 and the imaging unit 202 based on information from the image processing unit 204, and also, controls the display of the display unit 208 in cooperation with the memory control unit 205.

The non-volatile memory 212 is for example an electrically erasable programmable read-only memory (EE-PROM), and stores data such as control programs and constants for operation of the system control unit 211. The system memory 213 is for example a static random-access memory (SRAM), into which constants and variables for operation of the system control unit 211 and control programs read from the non-volatile memory 212 are loaded.

The operating unit 214 is formed by a power switch 214a, a mode selector switch 214b, a START/STOP switch 214c, and the like, that inputs a signal indicative of user operation into the system control unit 211. The power switch 214a is used to allow or block (ON/OFF) passage of power supplied from the power source unit 217. The mode selector switch 214b is used to select an operation mode of the digital video camera 100. Operation modes include a still-image recording mode, a video recording mode, and a playback mode. The START/STOP switch 214c is used to start or stop video recording in the video recording mode or still-image recording in the still-image recording mode.

The remote terminal 215 is a terminal that enables an external device to remotely control the digital video camera 100. The system control unit 211 can control the digital video camera 100 based on a command received from an external device through the remote terminal 215.

The TALLY LED 216 (a tally lamp) is a light emitting diode (LED) used to notify a user of the status of the digital video camera 100. For example, the system control unit 211 turns the TALLY LED 216 on with solid light when determining that the digital video camera 100 is recording images, and turns the TALLY LED 216 on with blinking light when determining that the battery 102 of the power source unit 217 has a small amount of power left.

The power source unit 217 includes the AC adapter 101 and the battery 102. The AC adapter 101 generates DC power from externally-acquired AC power. The AC adapter 101, which is formed for example by a switching regulator and the like, converts commercial AC voltage (AC 100V) to predetermined DC voltage for the digital video camera 100 (e.g., DC 6V to 8V), and supplies the DC voltage to the power source control unit 300. The battery 102 is, for example, a lithium-ion rechargeable battery, a nickel-metal hydride rechargeable battery, or an alkaline dry cell, and supplies predetermined DC power to the power source control unit 300. The power source unit 217 is not limited to including the AC adapter 101 and the battery 102, and may include any power source that outputs DC power. The power source unit 217 may include various different batteries. The AC adapter 101 and the battery 102 may be incorporated in the digital video camera 100, or detachably attached to the digital video camera 100.

The power source control unit 300 is formed by a power source detection circuit, a DC-DC converter, a regulator circuit, a switch circuit, and the like. The power detection circuit detects connection of a power source, the type of the power source connected, and the remaining battery level. The DC-DC converter and the regulator circuit perform conversion of power source voltage. The switch circuit is capable of selecting a circuit block to pass the power to in the digital video camera 100. The power source control unit 300 supplies certain parts of the digital video camera 100 with necessary voltages for necessary durations of time based on detection results and an instruction from the system control unit 211. The power source control unit 300 may include a charging circuit, and be configured to charge the battery 102 based on an instruction from the system control unit 211. The digital video camera 100 further includes an external output terminal to output power to an external device.

Figure 3:
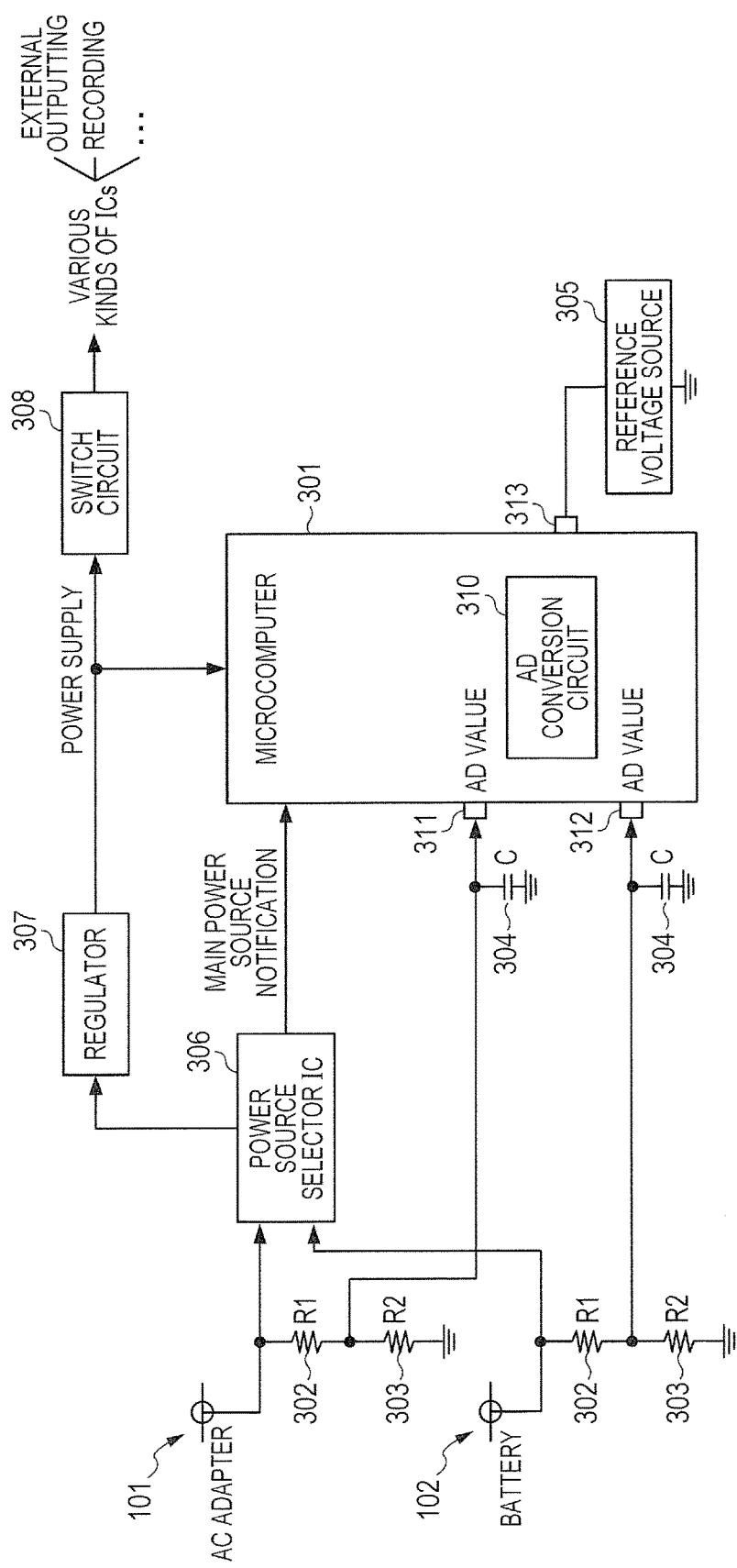
FIG. 3 is a block diagram of a power source control unit according to the first embodiment of the present invention.

FIG. 3 is a block diagram of the power source control unit 300 according to the embodiment. The power source control unit 300 includes a microcomputer 301, resistance elements 302 and 303, capacitors 304, a reference voltage source 305, a power source selector IC 306, a regulator 307, and a switch circuit 308.

The microcomputer 301 is a single-chip IC containing elements such as a CPU, a ROM, a RAM, and an input/output port, and takes overall control of the power source control unit 300. The microcomputer 301 has an AD conversion circuit 310 therein. The AD conversion circuit 310 includes AD ports 311, 312, and 313, and converts voltages inputted to the AD ports 311 and 312 into AD values, which are digital signals, based on a voltage inputted to the AD port 313. The AD conversion circuit 310 is formed using any circuit type, such as the successive approximation type, the parallel approximation type, and the delta sigma type. A voltage from the AC adapter 101 is inputted to the AD port 311 after being divided by the resistance elements 302 and 303, and a voltage from the battery 102 is inputted to the AD port 312 after being divided by the resistance elements 302 and 303. The resistances of the resistance elements 302 and 303 are R1 [Ω] and R2 [Ω], respectively.

Figure 4:
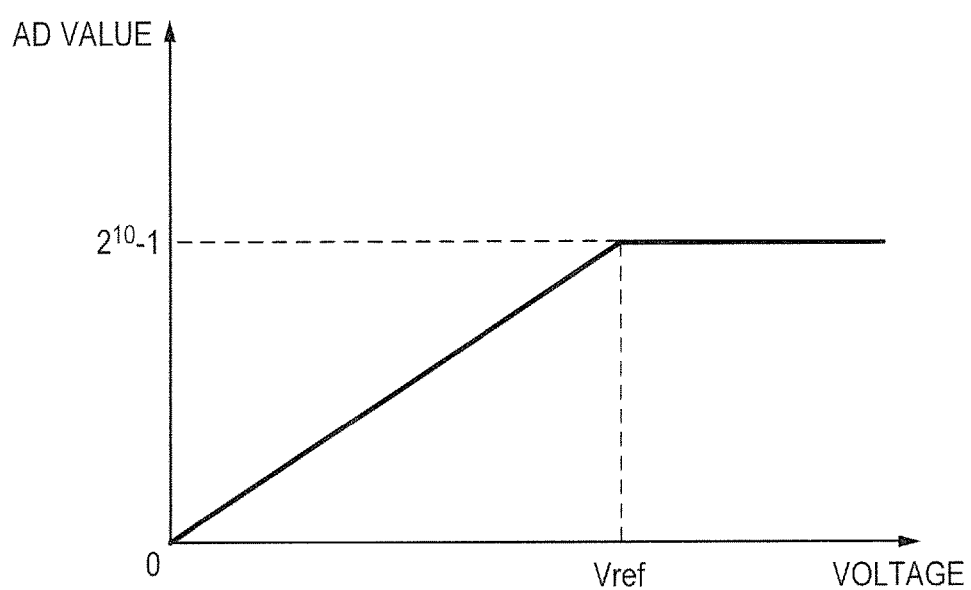
FIG. 4 is a graph showing the relation between a voltage and an AD value according to the first embodiment of the present invention.

The capacitors 304 for smoothing are placed in the stages on the power-source side of the AD ports 311 and 312, respectively. The capacitors 304 accumulate charges to reduce voltage fluctuations in AD conversion. In other words, voltage averaging is performed by a hardware circuit. A voltage from the reference voltage source 305 is inputted to the AD port 313. The reference voltage source 305 is for example a shank regulator and outputs a certain reference voltage Vref [V]. The AD values each represent the difference between the input voltage and the reference voltage Vref. If the AD conversion circuit 310 is capable of 10-bit output, the AD values are values from 0 to 1023, and the resolution of the AD conversion is 1024 (2 raised to the 10th power). FIG. 4 shows an example of the relation between an input voltage and the reference voltage Vref. The AD value increases in proportion to the input voltage, and is at its maximum when it equals the reference voltage Vref. The microcomputer 301 can calculate the voltage of the AC adapter 101 and the voltage of the battery 102 by the following formula (1):

$$\text{Voltage }[V] = V\text{ref} \times (R1+R2)/R2 \times AD \text{ value/resolution of } AD \text{ conversion} \quad (1)$$

where Vref is the reference voltage, (R1+R2)/R2 is a voltage dividing ratio, and the AD value is a result of the AD conversion.

The amount of power from the power source (power=voltage×current) is constant. Once the digital video camera 100 starts recording (REC) or outputting to another device, more power is supplied to the recording or the external output part, and the voltage of the power source decreases as a result. In other words, more power is supplied from a power source circuit in the power source control unit 300 to various kinds of ICs. The power is transferred to the various ICs through the regulator 307 and the switch circuit 308 and supplied (consumed) to execute a certain function (power supply target) in the digital video camera 100. For this reason, when a function that requires power starts, the voltage of the power source decreases. During recording, hardware related to a task such as recording is driven, increasing the power consumed by the digital video camera 100. Then, the AD value for the battery 102 drops. The AD value for the battery 102 drops also during external outputting. As a result, a battery voltage Vb calculated by Formula 1 decreases. The AD value, which has decreased when recording started, increases when the recording ends as a result of a decrease in current amount. Then, the battery voltage Vb obtained by Formula 1 also increases. Also, error is generated by AD conversion. Since the AD values (results of AD conversion) outputted from the AD ports 311 and 312 are each indicative of a voltage calculated based on the power coming from the power source, the AD values may decrease when the amount of power arriving at the AD ports is decreased by recording or external outputting.

For each of the power sources, the microcomputer 301 averages voltages calculated by Formula (1) over a predetermined period of time (e.g., 0.1 second to 0.2 second), and records the averaged voltage in the system memory 213 as the voltage of the power source. In other words, voltage averaging is performed using software processing.

The voltages of the AC adapter 101 and the battery 102 are inputted to the power source selector IC 306. The power source selector IC 306 compares the input voltages with each other, and determines which of the AC adapter 101 and the battery 102 is to be used as the main power source. The power source selector IC 306 also determines that the power source not selected as the main power source is a sub-power source. For example, the power source selector IC 306 selects the AC adapter 101 as the main power source and the battery 102 as the sub-power source, or in other words, electrically connects the AC adapter 101 to the regulator 307, when the voltage of the AC adapter 101 is larger than that of the battery 102. Also, the power source selector IC 306 selects the battery 102 as the main power source and the AC adapter 101 as the sub-power source when the voltage of the AC adapter 101 is smaller than a predetermined voltage. The power source selector IC 306 forms a determination unit.

After determining the main power source, the power source selector IC 306 notifies the microcomputer 301 of information on the main power source, such as the type of the main power source, and makes a switch of the power sources so that power from the main power source may be supplied to the regulator 307. The regulator 307 is formed by, for example, a DC-DC converter, a shank regulator, and the like, and supplies the power from the main power source to the microcomputer 301, various ICs in the digital video camera 100, an electronic device, and the like. Based on an instruction from the system control unit 211, the switch circuit 308 switches the destination to supply the power from the regulator 307.

Figure 5:
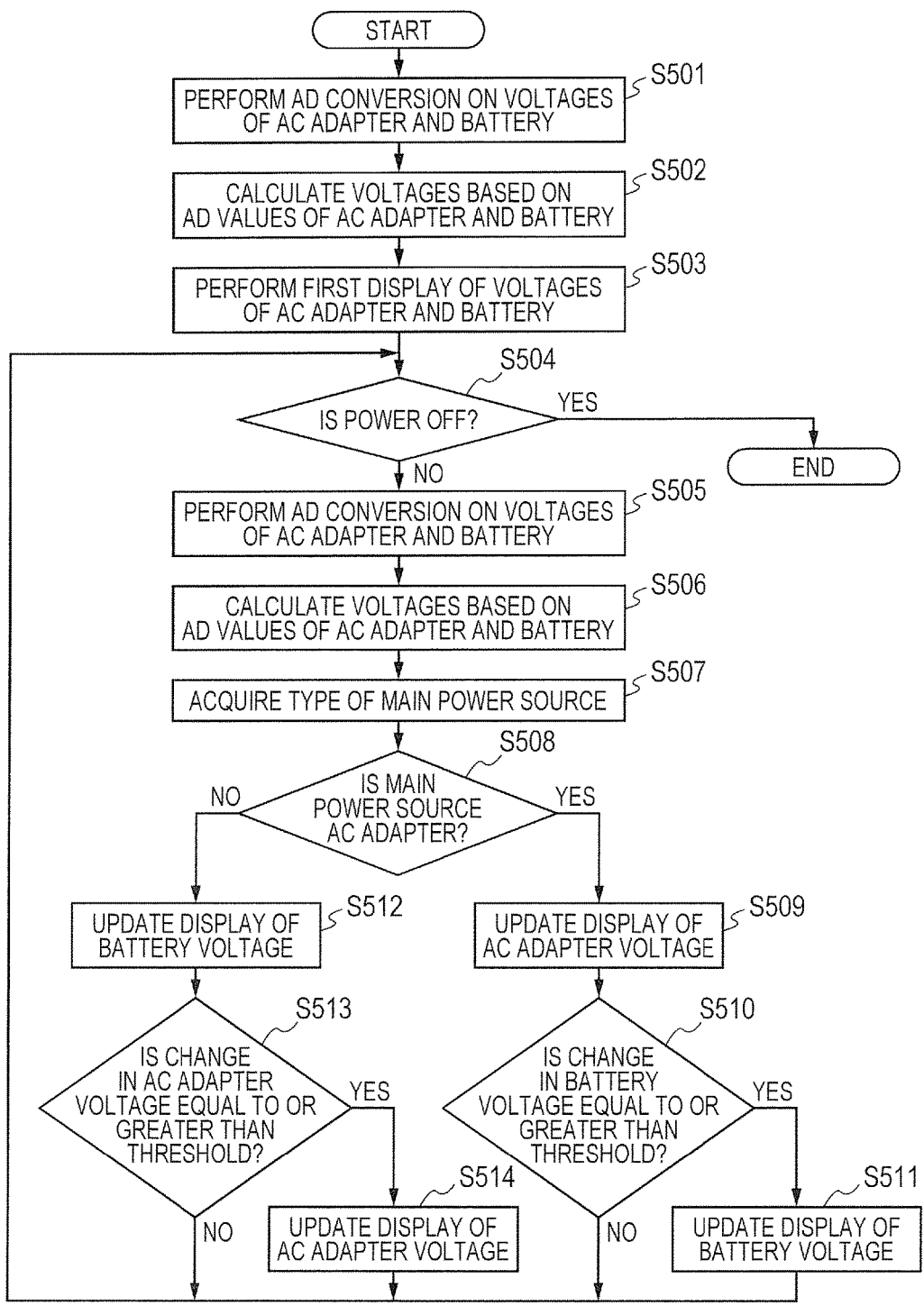
FIG. 5 is a flowchart illustrating operation of the electronic device according to the first embodiment of the present invention.

FIG. 5 is a flowchart illustrating the operation of the electronic device according to the embodiment. The processing in FIG. 5 is implemented when programs stored in the non-volatile memory 212 are loaded into the system memory 213 and executed by the system control unit 211. The processing starts when the digital video camera 100 is powered on.

In S501, the system control unit 211 causes the power source control unit 300 to perform AD conversion on the voltages of the AC adapter 101 and the battery 102. More specifically, the microcomputer 301 performs AD conversion on a voltage inputted to the AD port 311, to which the AC adapter 101 is connected, and a voltage inputted to the AD port 312, to which the battery 102 is connected.

In S502, the system control unit 211 calculates the voltages of the AC adapter 101 and the battery 102 using the AD values obtained in S501. These voltage values are calculated using Formula (1) described above. In S503, the system control unit 211 receives power-source information from the power source control unit 300 and sends it to the display unit 208. The power-source information contains the voltages of the main power source and the sub-power source. Based on the power-source information, the display unit 208 displays voltage information like the one shown in FIG. 1B, or specifically, the voltage 111 of the AC adapter 101, the voltage 112 of the battery 102, and the mark 113 indicating which is the main power source.

In S504, the system control unit 211 determines whether there has been a power-off instruction by user operation, or more specifically, whether the power switch 214a has been pressed down. When determining that the power switch 214a has been pressed down (Yes in S504), the system control unit 211 turns off the digital video camera 100 and ends the processing of the flowchart. When determining that the power switch 214a has not been pressed down (No in S504), the system control unit 211 proceeds to S505.

In S505, the system control unit 211 performs AD conversion on the voltages of the AC adapter 101 and the battery 102. More specifically, the microcomputer 301 performs AD conversion on a voltage inputted to the AD port 311, to which the AC adapter 101 is connected, and a voltage inputted to the AD port 312, to which the battery 102 is connected.

In S506, the system control unit 211 calculates the voltages of the AC adapter 101 and the battery 102 using the AD values obtained in S505. Each of these voltage values is calculated using Formula (1) given above, and averaged with other voltage values, and then stored in the system memory 213. In S507, the system control unit 211 receives information on the main power source, such as the type of the main power source, from the power source control unit 300, the information on the main power source having been sent from the power source selector IC 306 to the microcomputer 301 in the power source control unit 300. The system control unit 211 acquires the voltages of the AC adapter 101 and the battery 102 from the power source control unit 300, and stores them in the system memory 213. Based on the information on the main power source, the system control unit 211 displays the mark 113 on the display unit 208.

In S508, the system control unit 211 determines whether the main power source is the AC adapter 101. The system control unit 211 proceeds to S509 when determining that the main power source is the AC adapter 101 (Yes in S508), or proceeds to S512 when determining that the main power source is not the AC adapter 101, or in other words, that the main power source is the battery 102 (No in S508).

In S509, the system control unit 211 sends the display unit 208 the voltage of the AC adapter 101 acquired from the power source control unit 300 to update the voltage 111 of the AC adapter 101. This way, as to the main power source, the voltage calculated in S506 is used and displayed.

In S510, the system control unit 211 determines whether a change between the voltage of the battery 102 acquired from the power source control unit 300 and the voltage 112 of the battery 102 currently displayed on the display unit 208 is equal to or greater than a threshold. The threshold is a value predetermined based on an error range in AD conversion, and is for example 0.1 [V] or 0.2 [V]. Specifically, 0.1 [V] is a value close to the range of values indicated by AD values "1" to "3", and is three to four times (not more than four times) the smallest unit of an AD value, or a value in a range which is approximately 3/1024 of the resolution of the AD values (a proportion of the resolution). The AD-conversion error range may be a value obtained by an experimental AD conversion performed by the power source control unit 300, or besides the resolution of the AD conversion circuit 310 (1LSB), may be determined considering external perturbations such as noise. Since the value of the voltage 112 displayed on the display unit 208 is stored in the system memory 213, the system control unit 211 can make the comparison in S510. Alternatively, the voltage value does not have to be stored, and the system control unit 211 may make the comparison by acquiring the currently-displayed voltage from the display unit 208.

When determining that a change in the voltage of the battery 102 is equal to or greater than the threshold (Yes in S510), the system control unit 211 proceeds to S511, where the system control unit 211 sends the display unit 208 the voltage of the battery 102 acquired from the power source control unit 300 to update the voltage 112 of the battery 102. When determining that a change in the voltage of the battery 102 is not equal to or greater than the threshold, or in other words, is less than the threshold (No in S510), the system control unit 211 proceeds back to S504. The system control unit 211 iterates the steps from S504 at predetermined intervals.

In S512, the system control unit 211 sends the display unit 208 the voltage of the battery 102 acquired from the power source control unit 300 to update the voltage 112 of the battery 102. In S513, the system control unit 211 determines whether a change between the voltage of the AC adapter 101 acquired from the power source control unit 300 and the voltage 111 currently displayed on the display unit 208 is equal to or greater than a threshold. The threshold is a value predetermined based on an error range in AD conversion, and may be, for example, the same value as the threshold used in S510.

When determining that a change in the voltage of the AC adapter 101 is equal to or greater than the threshold (Yes in S513), the system control unit 211 proceeds to S514, where the system control unit 211 sends the display unit 208 the voltage of the AC adapter 101 acquired from the power source control unit 300, to update the voltage 111 of the AC adapter 101. When determining that a change in the voltage of the AC adapter 101 is not equal to or greater than the threshold (No in S513), the system control unit 211 proceeds back to S504. The system control unit 211 iterates the steps from S504 at predetermined intervals.

As described above, the system control unit 211 determines whether the voltage calculated in S506 is different from the currently-displayed voltage by the threshold or more, and only when the difference is equal to or greater than the threshold, updates the voltage display of the sub-power source. In other words, there is a threshold based on which to determine whether to update the voltage display of the sub-power source, and the voltage display of the sub-power source is updated when a change in a value obtained by averaging of voltages calculated using Formula (1) (a detected voltage) is equal to or greater than the threshold. If, on the other hand, a change in the detected voltage is not equal to or greater than the threshold, the voltage display of the sub-power source is not updated. Then, the voltage of the sub-power source on the display does not increase or decrease, reducing the possibility of giving a user a wrong impression that the sub-power source is being used when the main power source should be in use. If power from the sub-power source is being supplied to a device outside the digital video camera 100, the power decreases. Thus, when a change in voltage is equal to or greater than the threshold, a user should be notified of that value. If a threshold is set for the main power source, even if there is actually a decrease in voltage, the display of the main power source is not updated until the decrease reaches the threshold. To present an accurate value to the user, the detected value is displayed as-is as for the main power source.

The threshold for the sub-power source is set such that the threshold is slightly above the error range in AD conversion. With such a threshold, update of voltage display due to AD conversion error is reduced, to make it less likely to give a wrong impression that power from the unused power source (the sub-power source) is being consumed.

While the voltage of the main power source is susceptible to load fluctuations caused by video recording (imaging) or external outputting and therefore may have error, the voltage of the sub-power source is not susceptible to load fluctuations. For this reason, what needs to be considered for the sub-power source is an error range in AD conversion. However, if the sub-power source is susceptible to other outputs, the threshold for the sub-power source is set to be smaller than a change in voltage due to load fluctuations caused by recording or external outputting, so that actual voltage fluctuations can be displayed, which is for example a change in voltage due to a voltage drop in power supply to an external device during video recording. If the digital video camera is for professional use, its user knows that error may occur due to load fluctuations in the power source circuit. In such a case, it may look more natural to the user if the voltage is updated when recording starts or external outputting is performed.

In the embodiment, a change in voltage is compared with a predetermined threshold so that there may be hysteresis in the update of the voltage. In other words, the threshold in the embodiment defines a hysteresis range, and the voltage display is not updated by voltage fluctuations within the hysteresis range whose center value is the currently-displayed voltage.

According to the embodiment, the voltage display of the main power source is updated immediately, so that a user can be notified of an accurate status of the main power source. On the other hand, the voltage display of the sub-power source is updated with hysteresis, so that the value of the voltage display is less likely to increase or decrease due to AD conversion error. Thus, the voltage display may not give a feeling of strangeness to a user.

When the sub-power source is a battery, voltage display is not updated if a change in voltage is smaller than the threshold. On the other hand, when the sub-power is an AC adapter, voltage display may be updated even if a change in voltage is smaller than the threshold. Power in a battery does not increase or decrease unless the power is used or the battery is charged. Thus, a threshold is set to prevent the displayed voltage from increasing or decreasing due to AD conversion error. An AC adapter, on the other hand, is supplied with power constantly, and therefore even if the power from the AC adapter somewhat increases or decreases, the user is unlikely to misunderstand that the AC adapter is the main power source. Thus, a threshold does not need to be set for the AC adapter.

In the embodiment, the digital video camera 100 is used as an electronic device to which the present invention is applied, and power from the main power source is used for recording and external outputting. If the present invention is applied to a device other than a digital video camera, the main power source is also used for processing other than voltage display, such as driving in a case of an automobile, text entry, search processing, and the like in a case of a personal computer, playing, playback, and the like in a case of a music device.

OTHER EMBODIMENTS

The controls described above as being performed by the system control unit 211 and the power source control unit 300 may be performed by a single piece of hardware or distributed among two or more pieces of hardware to perform overall control of the device. The present invention is applied to the digital video camera 100 in the above embodiment, but is not limited to the example in the embodiment. The present invention is applicable to any electronic device that can be connected to more than one power source, such as a personal computer, a PDA, a mobile phone terminal, a portable image viewer, and a printer with a display. The present invention may also be applied to devices such as a digital photo frame, a music player, a game console, an e-book reader, a tablet terminal, a smartphone, a projection device, a home appliance with a display, and a vehicle-mounted device.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-153650, filed Aug. 4, 2016, which is hereby incorporated by reference herein in its entirety.

What is claimed is:
1. An electronic device comprising:
at least one processor programmed to cause the electronic device to:

acquire a result of AD conversion on a voltage of each of a main power source and a sub-power source, and detect an average value of the results of the AD conversion acquired over a predetermined period of time as each of the voltages of the main power source and the sub-power source; and control a display of the voltage of the main power source and a display of the voltage of the sub-power source on a display unit such that the displayed voltage of the main power source is updated to a voltage newly detected even if a change between the new voltage and the displayed voltage is smaller than a predetermined threshold, and the displayed voltage of the sub-power source is not updated to a voltage newly detected if a change between the new voltage and the displayed voltage is smaller than the predetermined threshold, but is updated to the voltage newly detected if the change between the new voltage and the displayed voltage is equal to or greater than the predetermined threshold.

2. The electronic device according to claim 1, wherein the predetermined threshold is set based on at least one of conditions including a resolution of the AD conversion and noise in the AD conversion.

3. The electronic device according to claim 1, wherein the predetermined threshold is a value not more than four times a smallest unit of an AD value.

4. The electronic device according to claim 1, wherein the predetermined threshold is a value within a range up to 3/1024 of a resolution of AD values.

5. The electronic device according to claim 1, wherein the change in the voltage of each of the main power source and the sub-power source is a difference between the voltage of the power source displayed on the display unit and the voltage of the power source newly detected.

6. The electronic device according to claim 1, further comprising a determination unit configured to determine that one of a first power source and a second power source is the main power source, and determine that the other one of the first power source and the second power source, which is not the main power source, is the sub-power source.

7. The electronic device according to claim 6, wherein the determination unit is configured to compare a voltage of the first power source with a voltage of the second power source, and determine that the power source with the higher voltage is the main power source.

8. The electronic device according to claim 6, wherein a mark indicating which of the first power source and the second power source is the main power source is displayed along with the displayed voltages.

9. The electronic device according to claim 1, wherein power from the main power source is also used for processing other than voltage display of the electronic device.

10. The electronic device according to claim 1, wherein the at least one processor further programmed to cause the electronic device to control the display of the voltage of the sub-power source on the display unit such that when the sub-power source is a battery, the displayed voltage of the battery is not updated to a voltage newly detected if a change between the new voltage and the displayed voltage is smaller than the predetermined threshold, and when the sub-power source is an AC adapter, the displayed voltage of the AC adapter is updated to a voltage newly detected even if the change between the new voltage and the displayed voltage is smaller than the predetermined threshold.

11. The electronic device according to claim 1, wherein the predetermined threshold is a value smaller than a change in the voltage of the main or sub-power source detected due to load fluctuations of the electronic device by image recording or external outputting.

12. A method for controlling an electronic device, comprising:

acquiring a result of AD conversion on a voltage of each of a main power source and a sub-power source, and detecting an average value of the results of the AD conversion acquired over a predetermined period of time as each of the voltages of the main power source and the sub-power source; and controlling a display of the voltage of the main power source and a display of the voltage of the sub-power source on a display unit such that the displayed voltage of the main power source is updated to a voltage newly detected even if a change between the new voltage and the displayed voltage is smaller than a predetermined threshold, and the displayed voltage of the sub-power source is not updated to a voltage newly detected if a change between the new voltage and the displayed voltage is smaller than the predetermined threshold, but is updated to the voltage newly detected if the change between the new voltage and the displayed voltage is equal to or greater than the predetermined threshold.

13. A non-transitory computer-readable storage medium storing a program that causes an electronic device to perform:

acquiring a result of AD conversion on a voltage of each of a main power source and a sub-power source, and detecting an average value of the results of the AD conversion acquired over a predetermined period of time as each of the voltages of the main power source and the sub-power source; and controlling a display of the voltage of the main power source and a display of the voltage of the sub-power source on a display unit such that the displayed voltage of the main power source is updated to a voltage newly detected even if a change between the new voltage and the displayed voltage is smaller than a predetermined threshold, and the displayed voltage of the sub-power source is not updated to a voltage newly detected if a change between the new voltage and the displayed voltage is smaller than the predetermined threshold, but is updated to the voltage newly detected if the change between the new voltage and the displayed voltage is equal to or greater than the predetermined threshold.

* * * * *